(12) United States Patent
Bang et al.

(10) Patent No.: US 9,888,565 B2
(45) Date of Patent: Feb. 6, 2018

(54) MEMORY MODULE AND SOLID STATE DRIVE HAVING THE SAME

(71) Applicant: Samsung Electronics Co., Ltd., Suwon-si, Gyeonggi-do (KR)

(72) Inventors: Kwang-Kyu Bang, Hwaseong-si (KR); Yusuf Cinar, Suwon-si (KR); Hwi-Jong Yoo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/176,778

(22) Filed: Jun. 8, 2016

(65) Prior Publication Data

US 2017/0094781 A1    Mar. 30, 2017

(30) Foreign Application Priority Data

Sep. 24, 2015  (KR) .................. 10-2015-0135209

(51) Int. Cl.
*G01B 7/16* (2006.01)
*H05K 1/02* (2006.01)
*H05K 1/11* (2006.01)
*H05K 1/18* (2006.01)

(52) U.S. Cl.
CPC ......... *H05K 1/0271* (2013.01); *H05K 1/0296* (2013.01); *H05K 1/115* (2013.01); *H05K 1/117* (2013.01); *H05K 1/181* (2013.01); *H05K 2201/10159* (2013.01)

(58) Field of Classification Search
CPC .... H05K 1/0271; H05K 1/0296; H05K 1/115; H05K 1/117; H05K 1/181; H05K 2201/10159

USPC ........................................................... 73/777
See application file for complete search history.

(56) References Cited

U.S. PATENT DOCUMENTS

| 5,561,373 | A * | 10/1996 | Itoh | ........................ H01L 22/14 257/E21.531 |
| 8,801,891 | B2 * | 8/2014 | Tsuruda | .................. B32B 38/10 156/345.16 |
| 9,046,545 | B2 * | 6/2015 | Takagaki | ............ B81C 1/00214 |
| 2008/0066951 | A1 * | 3/2008 | Goergen | .............. H05K 1/0218 174/255 |
| 2012/0327025 | A1 * | 12/2012 | Huska | ..................... G06F 3/016 345/174 |
| 2016/0012174 | A1 * | 1/2016 | Shin | .................... G06F 17/5009 716/112 |

FOREIGN PATENT DOCUMENTS

| JP | 2005-010103 | 1/2005 |
| JP | 2007-317873 | 12/2007 |
| KR | 1020080005795 | 1/2008 |
| KR | 10-1112567 | 12/2009 |
| KR | 10-1053141 | 7/2011 |
| KR | 10-1079864 | 10/2011 |
| KR | 10-1128322 | 3/2012 |
| KR | 102014022180 | 2/2014 |

* cited by examiner

*Primary Examiner* — Max Noori
(74) *Attorney, Agent, or Firm* — Myers Bigel, P.A.

(57) ABSTRACT

A memory module includes a module board extending in one direction, a plurality of electronic elements mounted on the module board, and at least one stress detection pattern in a position between the electronic elements or adjacent to one or more of the electronic elements on the module board and including a plurality of strips configured to indicate a stress level generated in the position by an external force applied to the module board.

20 Claims, 8 Drawing Sheets

MEMORY MODULE AND SOLID STATE DRIVE HAVING THE SAME

RELATED APPLICATIONS

This application claims priority under 35 U.S.C. § 119 to Korean Patent Application No. 10-2015-0135209, filed on Sep. 24, 2015, the contents of which are incorporated by reference herein in their entirety.

BACKGROUND

Example embodiments relate to a memory module and a solid state drive having the same. More particularly, example embodiments relate to a memory module including a plurality of memory devices and a solid state drive having the same.

A memory module such as solid state drive (SSD) may be connected to a desk top computer or notebook using a host interface. For example, when a connector of the memory module is inserted into a socket of a notebook computer, a module board of the memory module may be deflected or bent by an external force to generate a stress on a wiring or solder joint in the module board. Further, in use of the memory module, an impact may be applied to the memory module. Due to the deflection or impact, a failure, e.g., crack, disconnection, etc. may occur in the wiring or the solder joint. However, it may be difficult to precisely find the defective site and determine a magnitude of a stress exerted thereon.

SUMMARY

Example embodiments provide a memory module capable of determining and predicting a stress level exerted thereon.

Example embodiments provide a solid state disk including the memory module.

According to example embodiments, a memory module includes a module board extending in one direction, a plurality of electronic elements mounted on the module board, and at least one stress detection pattern in a position between the electronic elements or adjacent to one or more of the electronic elements on the module board and including a plurality of strips configured to indicate a stress level generated in the position by an external force applied to the module board.

In example embodiments, the strips may extend on a surface of the module board and may have different widths from each other or relative to one another.

In example embodiments, the widths of the strips may be between the maximum and the minimum of widths of wirings formed in the module board for interconnection with the electronic elements.

In example embodiments, a respective one of the strips may include two directional strips extending in different directions from each other.

In example embodiments, the stress detection pattern may further include a via structure connected to a respective one of the strips and penetrating through at least a portion of the module board.

In example embodiments, the stress detection pattern may further include a pad structure connected to the via structure, with the pad structure configured as a detecting pad for detecting electrical characteristics of the strip.

In example embodiments, the strips may include a first strip having a first width, a second strip having a second width greater than the first width, and a third strip having a third width greater than the second width.

In example embodiments, the first to third widths may be between the maximum and the minimum of widths of wirings formed in the module board.

In example embodiments, the first to third strips may each include a first directional strip extending in a first direction and a second directional strip extending in a second direction perpendicular to the first direction, respectively.

In example embodiments, the stress detection pattern may further include one or more via structures connected to each of the first to third strips and penetrating at least a portion of the module board, and a pad structure connected to each of the via structures.

According to example embodiments, a solid state drive includes a module board extending in one direction, a plurality of non-volatile memory devices mounted on the module board, a controller mounted on the module board and configured to control the non-volatile memory devices, and at least one stress detection pattern in a position between the non-volatile memory devices and the controller or adjacent to the non-volatile memory devices on the module board and including a plurality of strips configured to indicate a stress level generated in the position by an external force applied to the module board.

In example embodiments, the strips may extend on a surface of the module board and may have different widths from each other or relative to one another.

In example embodiments, the widths of the strips may be between the maximum and the minimum of widths of wirings for interconnection with the plurality of non-volatile memory devices and/or the controller.

In example embodiments, a respective one of the strips may include two directional strips extending in different directions from each other.

In example embodiments, the stress detection pattern may further include a via structure connected to each strip and penetrating at least a portion of the module board, and a pad structure connected to each via structure.

In example embodiments, a memory module includes a module board, a plurality of electronic elements mounted on the module board, and at least one stress detection pattern in a position on the module board. The at least one stress detection pattern includes a plurality of strips configured to indicate a stress level generated in the position in response to an external force applied to the module board.

In example embodiments, the stress detection pattern includes a first strip having a first width, a second strip having a second width that is greater than the first width, and a third strip having a third width that is greater than the second width. The first, second and third strips may be parallel and spaced apart from one another.

In example embodiments, the memory module includes wires having different widths formed in the module board for interconnection of the electronic elements. The first width of the first strip may correspond to a minimum wire width of the wires, the second width of the second strip may correspond to a median wire width of the wires, and/or the third width of the third strip may correspond to a maximum wire width of the wires.

In example embodiments, the at least one stress detection pattern includes first and second stress detection patterns. The first stress detection pattern may include first, second and third parallel and spaced apart strips that extend in a first direction along the module board. The second stress detection pattern may include first, second and third parallel and spaced apart strips that extend in a second direction along the module board that is perpendicular to the first direction.

In example embodiments, each one of the strips is configured to produce a visual indicia to indicate the stress level at the strip in response to the applied force and/or each one of the strips is configured to provide an electrical signal to indicate the stress level at the strip in response to the applied force.

According to example embodiments, a memory module may include a stress detection pattern disposed on a module board and to indicate a stress level generated by an applied external force, and the stress detection pattern may include a plurality of detection strips having dimensions corresponding to actual wirings formed in the module board.

Accordingly, the detection strips may be inspected to determine and predict a direction and magnitude of the external force exerted on the module board, a possibility of crack, etc. Further, analysis data may be collected from a plurality of the memory modules having the detection patterns and may be used to be reflected in a design for a memory module.

BRIEF DESCRIPTION OF THE DRAWINGS

Example embodiments will be more clearly understood from the following detailed description taken in conjunction with the accompanying drawings.

FIG. 1 is a plan view illustrating a memory module in accordance with example embodiments.

FIG. 2 is a bottom view illustrating the memory module in FIG. 1.

FIG. 3 is a plan view illustrating a stress detection pattern of a stress detector in FIG. 1.

FIG. 4 is a cross-sectional view taken along the line A-A' in FIG. 3.

FIGS. 5 to 7 are plan views illustrating stress detection patterns of a stress detector in FIG. 1.

FIG. 8 is a side view illustrating the memory module in FIG. 1 in a deflected state by an external force applied thereto.

FIG. 9 is a plan view illustrating a stress distribution across the detection pattern of FIG. 3 in the deflected state.

FIG. 10 is a block diagram illustrating an electronic device in accordance with example embodiments.

DETAILED DESCRIPTION OF EXAMPLE EMBODIMENTS

Figure 1:
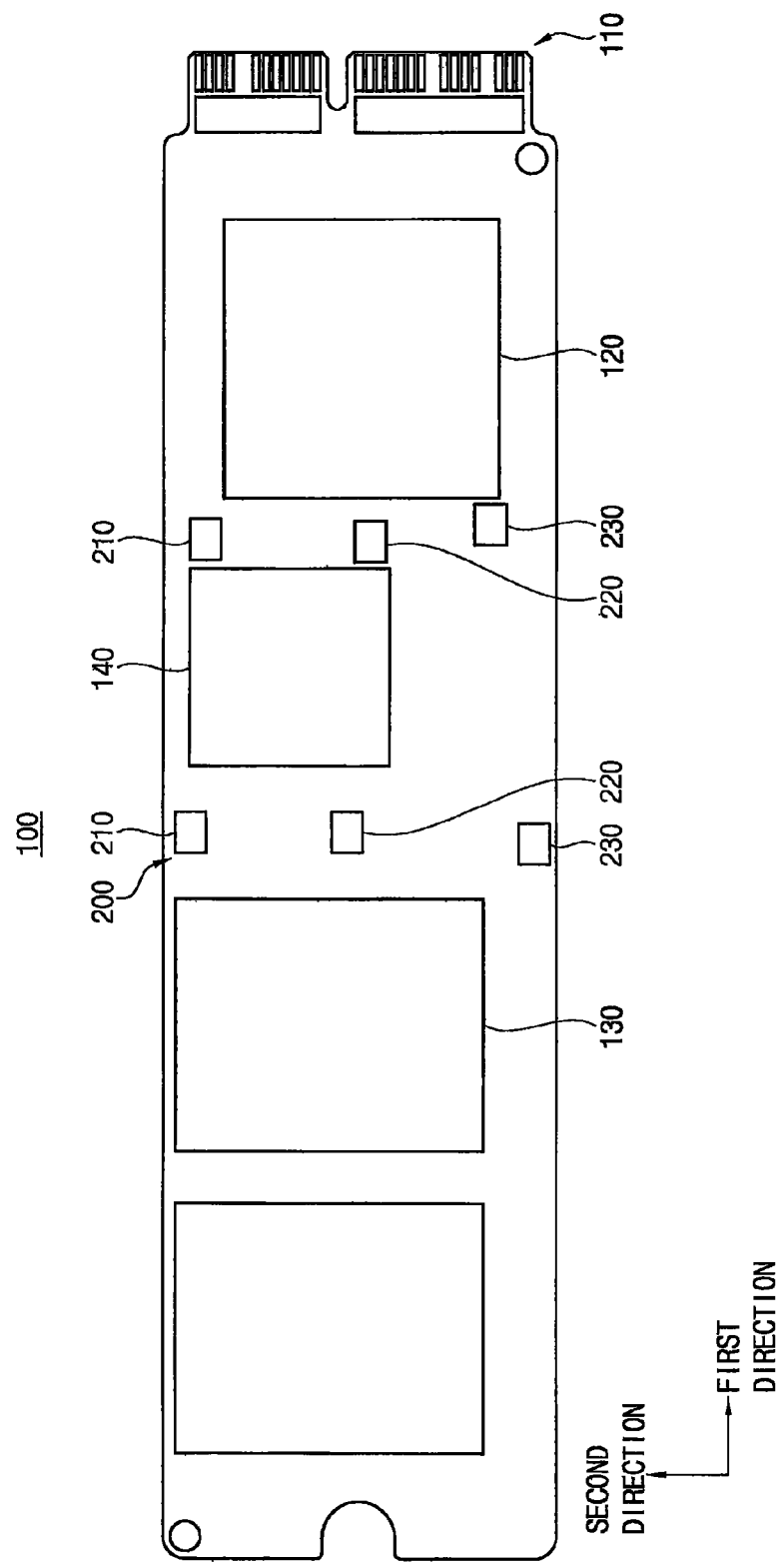
FIGS. 1 to 10 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
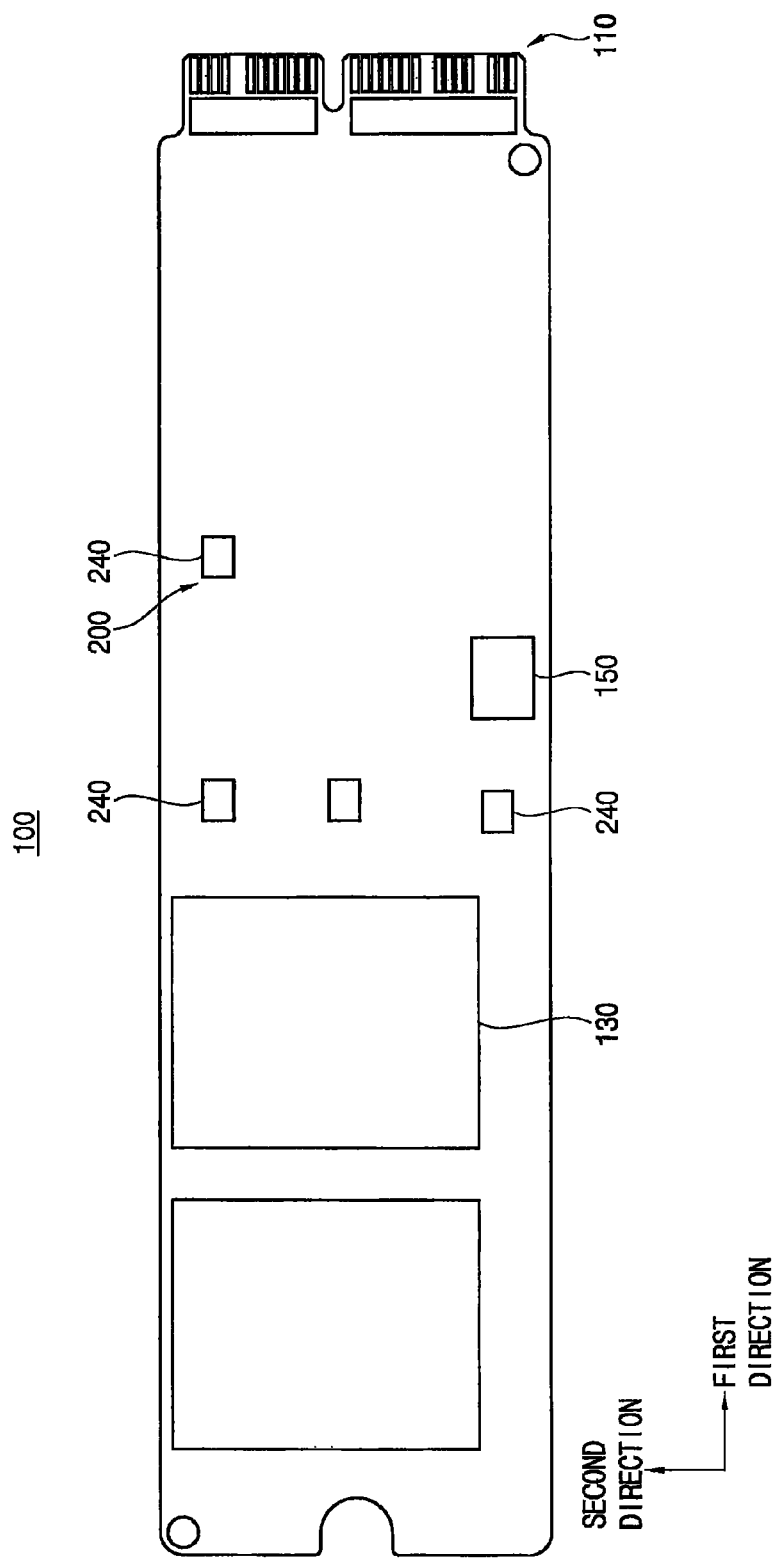

FIG. 1 is a plan view illustrating a memory module in accordance with example embodiments. FIG. 2 is a bottom view illustrating the memory module in FIG. 1. FIGS. 3 and 5 to 7 are plan views illustrating stress detection patterns of a stress detector in FIG. 1. FIG. 4 is a cross-sectional view taken along the line A-A' in FIG. 3.

Referring to FIGS. 1 to 7, a memory module 100 may include a module board 102, a plurality of electronic elements mounted on the module board 102, and a stress detector 200 positioned between the electronic elements or adjacent to one or more of the electronic elements on the module board 102.

In example embodiments, the module board 102 may be a single-layered or multi-layered circuit substrate having an upper surface and a lower surface opposite to one another. For example, the module board 102 may be a printed circuit board (PCB). The PCB may include wirings 104 and vias connected to the wirings 104. The wirings may include printed Circuit patterns for interconnection with the electronic elements.

The module board 102 may extend in a first direction. The module board 102 may have a rectangular or square shape. A connector 110 having connection terminals for connection with a host system may be provided at or in a first side portion of the module board 102.

In example embodiments, the electronic elements may include an SSD controller 120, non-volatile memory devices 130 and a buffer memory device 140. The electronic elements may be mounted on the module board 102 in the first direction to be provided as a solid state drive (SSD). The SSD may be used to replace a hard disk in a PC, notebook, etc. The SSD may be used in a mobile device such as smart phone, tablet PC, digital camera, MP3 player, PDA, etc.

The memory module may be attached to or detached from the host system through the connector 110. For example, the host system may be notebook computer or netbook. The connector 110 of the module board 102 may be inserted into a circuit board socket of the host system. The circuit board socket may have a female connector. Accordingly, the memory module 100 may be electrically connected to the host system by the connection terminals.

The SSD controller 120 may be positioned adjacent to the connector 110 on the upper surface of the module board 102. When viewed in the plan view of FIG. 1, the SSD controller 120 may be positioned in the right side of the module board 102.

The SSD controller 120 may communicate a signal with the host using a host interface. The host interface may include a universal serial bus (USB), a small computer system interface (SCSI), a PCI express, an ATA, a parallel ATA, a serial ATA, a serial attached SCSI, etc. The signal communicated between the SSD controller 120 and the host may include a command, an address, data, etc. The SSD controller 120 may analyze and process the signal inputted from the host.

A plurality of the non-volatile memory devices 130 may be positioned at or adjacent to a second side portion opposite to the connector 110 on the upper surface and the lower surface of the module board 102. For example, two non-volatile memory devices 130 may be disposed on the upper surface of the module board 102 and two non-volatile memory devices 130 may be disposed on the lower surface of the module board 102. When viewed in the plan view of FIG. 1, the non-volatile memory devices 130 may be positioned in the left side of the module board 102.

The non-volatile memory devices 130 may be used as a storage medium of the SSD. For example, the non-volatile memory device 130 may include NAND flash memories. The non-volatile memory devices 130 may be connected to the SSD controller 120 through at least one channel. The SSD may use non-volatile memories such as PRAM, MRAM, ReRAM, FRAM, etc. as a storage medium in place of flash memory.

The buffer memory device 140 may be positioned adjacent to the SSD controller 120 on the upper surface of the module board 102. When viewed in the plan view of FIG. 1, the buffer memory device 140 may be positioned in the right side of the module board 102.

The buffer memory device 140 may be used as a buffer area to temporarily store data received from the host or to temporarily store data read from the non-volatile memory devices 130. Additionally, the buffer memory device 140 may be used to drive software used for an effective management of the non-volatile memory devices 130. Further, the buffer memory device 140 may be used to store metadata received from the host and/or may be used to store cache data.

For example, the buffer memory device 140 may include a plurality of DRAM packages. The DRAM package may include a package substrate and at least one DRAM chip mounted on the package substrate. The SSD may be embodied by replacing the DRAM with volatile memories such as SRAM, etc. or non-volatile memories such as flash memory, FRAM, MRAM, ReRAM, etc.

The SSD may further include a power management IC (PMIC) 150 for adjusting a power applied to the electronic elements. The PIMC 150 may be positioned in the middle region on the lower surface of the module board 102.

In example embodiments, the stress detector 200 may include at least one stress detection pattern 210, 220, 230, 240 for detecting a stress level generated by an external force applied to the module board 102. The stress detection patterns 210, 220, 230 and 240 may be disposed in a risk position adjacent to, e.g., the wiring or a solder joint, where it is likely that a relatively large warpage is generated due to the stress so that a crack occurs.

As illustrated in FIGS. 1 and 2, first to fourth detection patterns 210, 220, 230 and 240 (stress detection patterns) may be positioned at positions (risk zones) having a relative weakness to the warpage or bending of the module board 102.

The first to third detection patterns 210, 220 and 230 may be positioned in the middle region on the upper surface of the module board 102. The first to third detection patterns 210, 220 and 230 may be arranged in a second direction perpendicular to the first direction to be spaced apart from each other. The first to third detection patterns 210, 220 and 230 may be positioned between the non-volatile memory device 130 and the buffer memory device 140 and between the buffer memory device 140 and the SSD controller 120, respectively.

The fourth detection patterns 240 may be positioned in the middle region on the lower surface of the module board 102. The fourth detection patterns 240 may be arranged in the second direction to be spaced apart from each other. The fourth detection patterns 240 may be positioned between the non-volatile memory device 130 and the PMIC 150 and adjacent to the PMIC 150.

Figure 3:
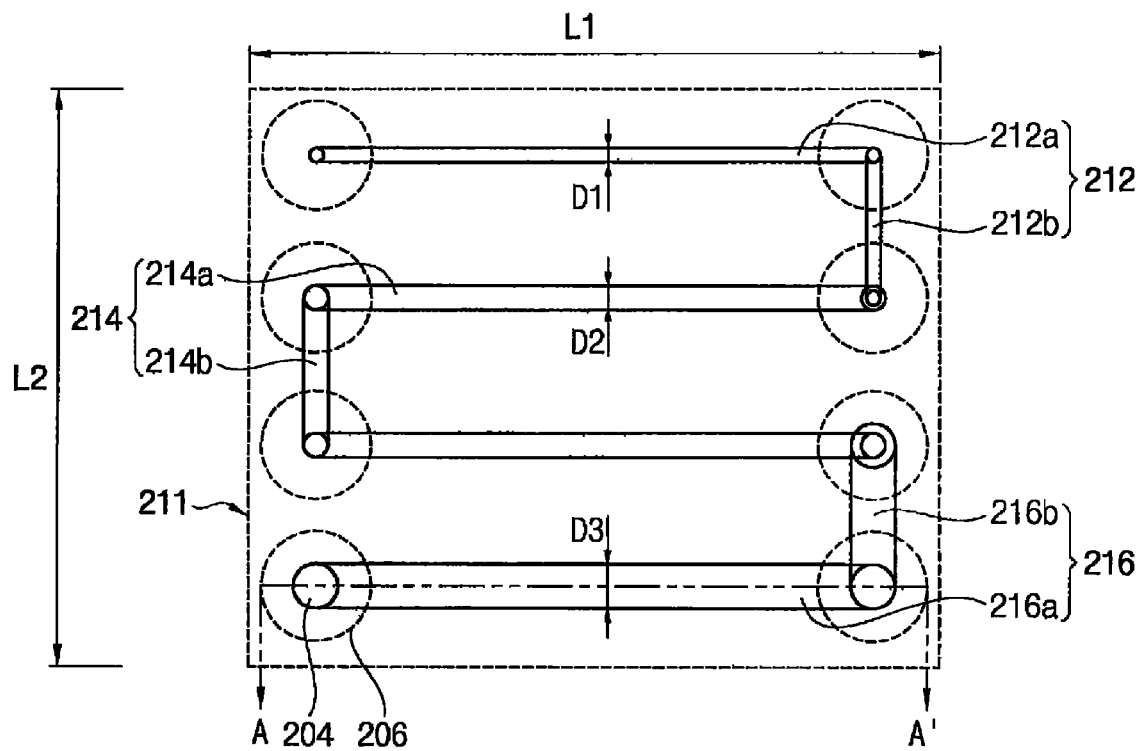
Figure 4:
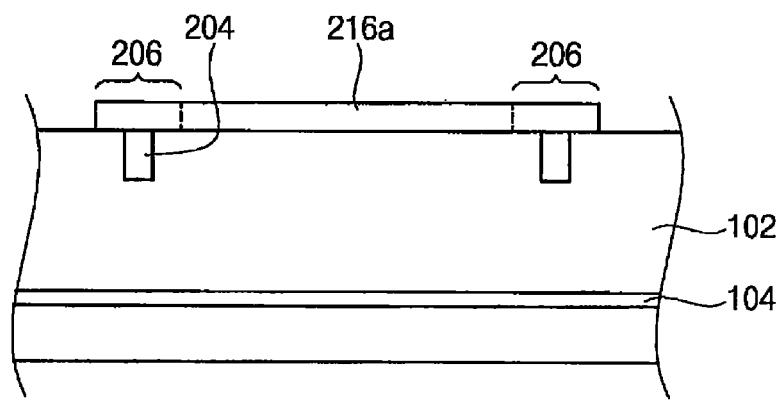

As illustrated in FIGS. 3 and 4, in example embodiments, the first detection pattern 210 may include first, second and third strips 212, 214 and 216 arranged in a first detection region 211. The first detection region 211 may correspond to a position (risk zone) having a relative weakness to the warpage of the module board 102. For example, a width length L1 of the first detection region 211 may be within a range of 1 mm to 2 mm, and a height length L2 of the first detection region 211 may be within a range of 2 mm to 3 mm. The first, second and third strips 212, 214 and 216 may extend on the upper surface of the module board 102 to have a predetermined length. For example, the first, second and third strips may be formed by a process for forming the wirings.

The first strip 212 may have a first width D1. The second strip 214 may have a second width D2 greater than the first width D1. The third strip 216 may have a third width D3 greater than the second width D2. The widths D1, D2 and D3 of the first to third strips 212, 214 and 216 may be determined in consideration of widths of the wirings formed on the module board 102. For example, the first strip 212 may have a width of about 70 µm, the second strip 214 may have a width of about 80 µm, and the third strip 216 may have a width of about 150 µm.

In example embodiments, the widths of the first to third strips may be determined as a value between the maximum and the minimum of the wiring width. The first width D1 may correspond to the minimum value of the wiring width, the second width D2 may correspond to the median value of the wiring width, and the third width D3 may correspond to the maximum value of the wiring width. The first strip 212 may be a risk check pattern, the second strip 214 may be a reference pattern, and the third strip 216 may be a margin check pattern.

Accordingly, whether crack has occurred in any one of the first to third strips may be detected by the naked eye or a vision camera to analyze the impact level applied to the module board 102. Further, whether a failure, e.g., crack, disconnection, etc. may possibly occur in any one of the wirings corresponding to the first to third strips may be predicted.

The first to third strips may include two directional strips (extending patterns) extending in different directions. For example, the first to third strips may include a first directional strip extending in a first direction and a second directional strip extending in a second direction perpendicular to the first direction, respectively.

In particular, the first strip 212 may include a first width directional strip 212a extending in the first direction and a first length or height directional strip 212b extending in the second direction. The first width directional strip 212a and the first length directional strip 212b may be connected to each other. A length of the first width directional strip 212a may be greater than a length of the first length directional strip 212b.

The second strip 214 may include a second width directional strip 214a extending in the first direction and a second length or height directional strip 214b extending in the second direction. The second width directional strip 214a and the second length directional strip 214b may be connected to each other. The second strip 214 may include two second width directional strips 214a which are arranged to be spaced apart from each other. A length of the second width directional strip 214a may be greater than a length of the second length directional strip 214b.

The third strip 216 may include a third width directional strip 216a extending in the first direction and a third length or height directional strip 212b extending in the second direction. The third width directional strip 216a and the third length directional strip 212b may be connected to each other. A length of the third width directional strip 216a may be greater than a length of the third length directional strip 212b.

The first width directional strip 212a, the two second width directional strips 214a and the third width directional strip 216a may be arranged along the second direction to be spaced apart from each other. The first length directional strip 212b and the third length directional strip 212b may be arranged (e.g., aligned) in the same direction and parallel to the second length directional strip 214b.

The first, second and third strips 212, 214 and 216 may be connected to each other. The first length directional strip 212b may be connected to one of the two second width directional strips 214a. The third length directional strip 212b may be connected to another of the two second width directional strips 214a. The first, second and third width directional strips 212a, 214a and 216a may have the same length. The first, second and third length directional strips 212b, 214b and 212b may have the same length.

Accordingly, whether crack has occurred in any one of the width directional strip and the length directional strip may be detected to determine a direction of a force exerted on the module board 102. Further, since the length of the width directional strip is greater than the length of the length directional strip, a distribution of a stress exerted in the first direction may be detected more precisely than a distribution of a stress exerted in the second direction.

In example embodiments, the first detection pattern 210 may include via structures 204 and pad structures 206 connected to each of the via structures 204. The via structures 204 may be connected to each of the first to third strips 212, 214 and 216 and penetrate through at least a portion of the module board 102. The via structure 204 may penetrate completely or partially through the board 102. A diameter of the via structure may be determined in consideration of diameters of the vias formed in the module board 102. For example, the diameter of the via structure 204 may be within a range of 300 µm to 400 µm.

The pad structures 206 connected to both ends of the first width directional strip 212a may be used as detecting pads to detect electric properties of the first width directional strip 212a. The pad structures connected to both ends of the first length directional strip 212b may be used as detecting pads to detect electric properties of the first length directional strip 212b. Accordingly, the electric properties of the first strip 212 may be analyzed to determine whether a failure has occurred in the first strip 212. Similarly, electric properties of the second strip 214 and the third strip 216 may be detected to determine whether a failure has occurred in the second strip 214 and the third strip 216, respectfully. The strips may be configured to provide an electric or electrical signal indicating a level and/or location of a stress concentration in response to an applied force.

Since the via structures 204 are connected to each of the first to third strips 212, 214 and 216, the first to third strips may have a physical structure substantially the same as or similar to those of the actual wirings formed in the module board. Accordingly, the strips of the detection pattern may serve as an indication pattern representing a range of a stress exerted on the actual wirings.

Figure 5:
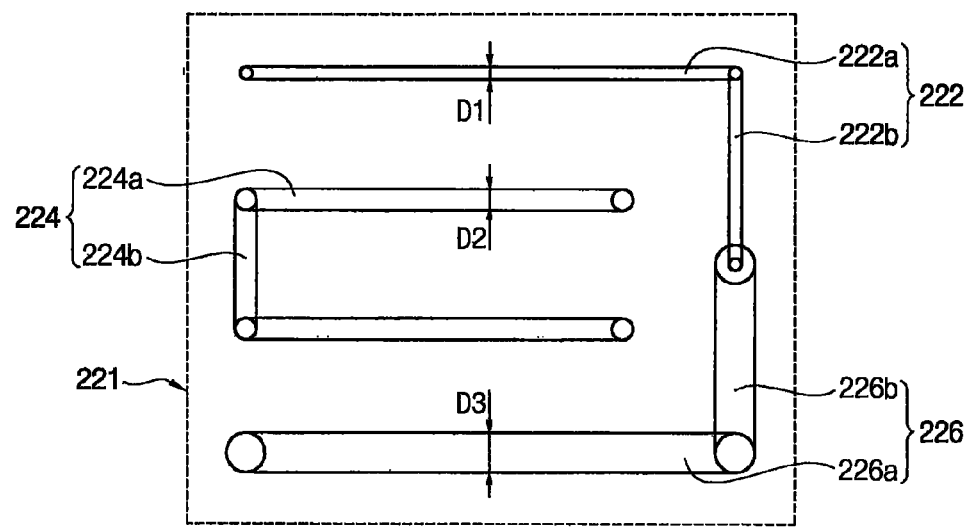

As illustrated in FIG. 5, the second detection pattern 220 may include first, second and third strips 222, 224 and 226 arranged in a second detection region 221. The first strip 222 may have a first width D1. The second strip 224 may have a second width D2 greater than the first width D1. The third strip 226 may have a third width D3 greater than the second width D2.

The first strip 222 may include a first width directional strip 222a extending in the first direction and a first length or height directional strip 222b extending in the second direction. A length of the first width directional strip 222a may be greater than a length of the first length directional strip 222b.

The second strip 224 may include a second width directional strip 224a extending in the first direction and a second length or height directional strip 224b extending in the second direction. The second strip 224 may include two second width directional strips 224a which are arranged to be spaced apart from each other. A length of the second width directional strip 224a may be greater than a length of the second length directional strip 224b.

The third strip 226 may include a third width directional strip 226a extending in the first direction and a third length or height directional strip 222b extending in the second direction. A length of the third width directional strip 226a may be greater than a length of the third length directional strip 222b.

The first width directional strip 222a, the two second width directional strips 224a and the third width directional strip 226a may be arranged along the second direction to be spaced apart from each other. The first length directional strip 222b and the third length directional strip 222b may be arranged (e.g., aligned) in the same direction and parallel to the second length directional strip 224b.

The first strip 222 and the third strip 226 may be connected to each other. The second strip 224 may be separate from (e.g., not connected to) the first and third strip 222 and 226. The first length directional strip 222b of the first strip 222 may be connected to the third length directional strip 222b of the third strip 226. The length of the second width directional strip 224a may be less than those of the first and third width directional strips 222a and 226a. The length of the second length directional strip 224b may be less than those of the first and third length directional strips 222b and 222b.

Figure 6:
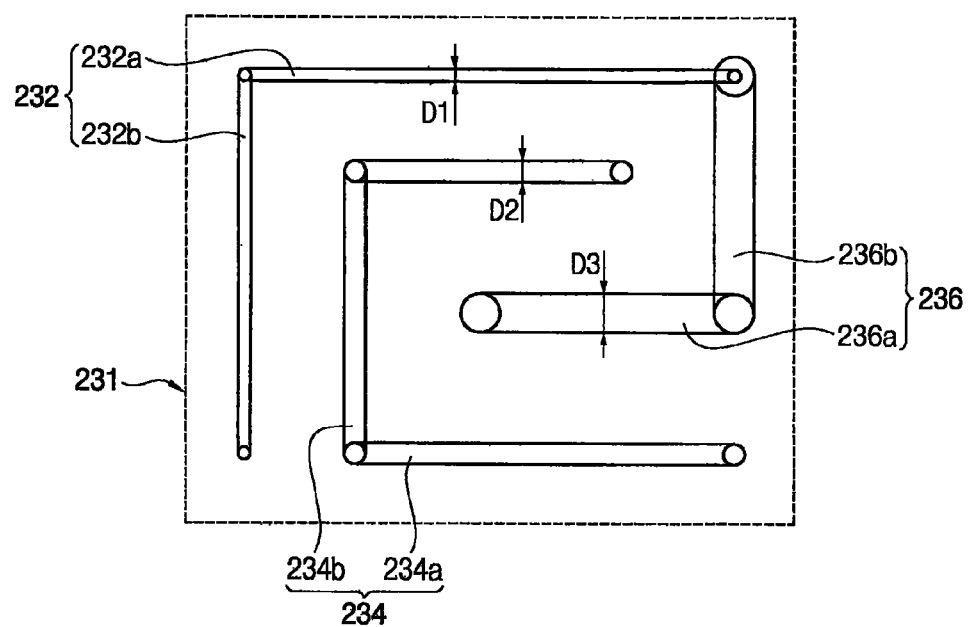

As illustrated in FIG. 6, the third detection pattern 230 may include first, second and third strips 232, 234 and 236 arranged in a third detection region 231. The first strip 232 may have a first width D1. The second strip 234 may have a second width D2 greater than the first width D1. The third strip 236 may have a third width D3 greater than the second width D2.

The first strip 232 may include a first width directional strip 232a extending in the first direction and a first length or height directional strip 232b extending in the second direction. A length of the first width directional strip 232a may be greater than or the same as a length of the first length directional strip 232b.

The second strip 234 may include a second width directional strip 234a extending in the first direction and a second length or height directional strip 234b extending in the second direction. The second strip 234 may include two second width directional strips 234a which are arranged to be spaced apart from each other and may have different lengths. The length of one of the two second width directional strip 234a may be greater than a length of the second length directional strip 234b. The length of another of the two second width directional strip 234a may be the same as a length of the second length directional strip 234b.

The third strip 236 may include a third width directional strip 236a extending in the first direction and a third length or height directional strip 232b extending in the second direction. A length of the third width directional strip 236a may be the same as a length of the third length directional strip 232b.

The first width directional strip 232a, the two second width directional strips 234a and the third width directional strip 236a may be arranged along the second direction to be spaced apart from each other. The first length directional strip 232b, the second length directional strip 234b and the third length directional strip 232b may be arranged along the first direction to be spaced apart from each other.

The first strip 232 and the third strip 236 may be connected to each other. The second strip 234 may be separate from (e.g., not connected to) the first and third strip 232 and 236. The first width directional strip 232a of the first strip 232 may be connected to the third length directional strip 232b of the third strip 236. The length of the first width directional strip 232a may be less or greater than those of the second and third width directional strips 234a and 236a. The length of the second length directional strip 234b may be the same as the length of the third length directional strip 232b.

Figure 7:
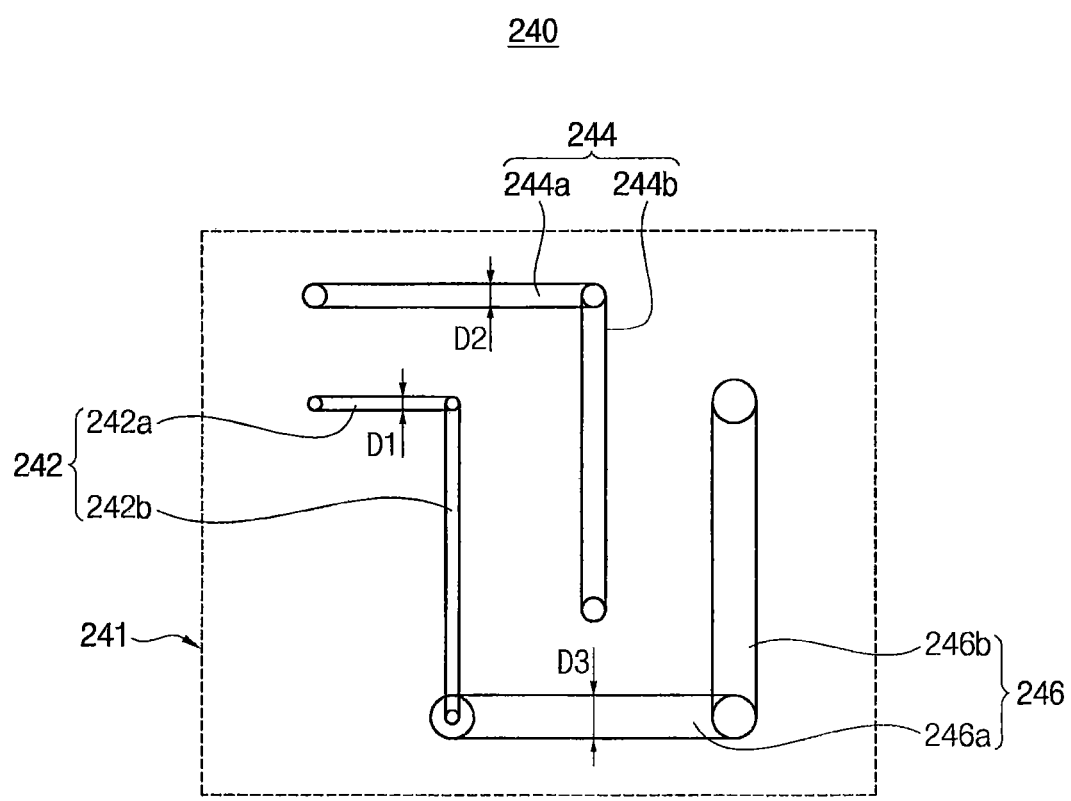

As illustrated in FIG. 7, the fourth detection pattern 240 may include first, second and third strips 242, 244 and 246 arranged in a fourth detection region 241. The first strip 242 may have a first width D1. The second strip 244 may have a second width D2 greater than the first width D1. The third strip 246 may have a third width D3 greater than the second width D2.

The first strip 242 may include a first width directional strip 242a extending in the first direction and a first length or height directional strip 242b extending in the second direction. A length of the first width directional strip 242a may be less than a length of the first length directional strip 242b.

The second strip 244 may include a second width directional strip 244a extending in the first direction and a second length or height directional strip 244b extending in the second direction. The length of the second width directional strip 244a may be less than a length of the second length directional strip 244b.

The third strip 246 may include a third width directional strip 246a extending in the first direction and a third length or height directional strip 242b extending in the second direction. A length of the third width directional strip 246a may be less than a length of the third length directional strip 242b.

Accordingly, since the length of the length directional strip is greater than the length of the width directional strip, a distribution of a stress exerted in the second direction may be detected more precisely than a distribution of a stress exerted in the first direction.

The second width directional strips 244a, the first width directional strip 242a and the third width directional strip 246a may be arranged along the second direction to be spaced apart from each other. The first length directional strip 242b, the second length directional strip 244b and the third length directional strip 242b may be arranged along the first direction to be spaced apart from each other.

The first strip 242 and the third strip 246 may be connected to each other. The second strip 244 may be separate from (e.g., not connected to) the first and third strip 242 and 246. The first length directional strip 242b of the first strip 242 may be connected to the third width directional strip 246a of the third strip 246. The lengths of the second width directional strip 244a and the third width directional strip 246a may be greater than the length of first width directional strips 242. The first, second and third length directional strips 242b, 244b and 242b may have the same length.

Figure 8:
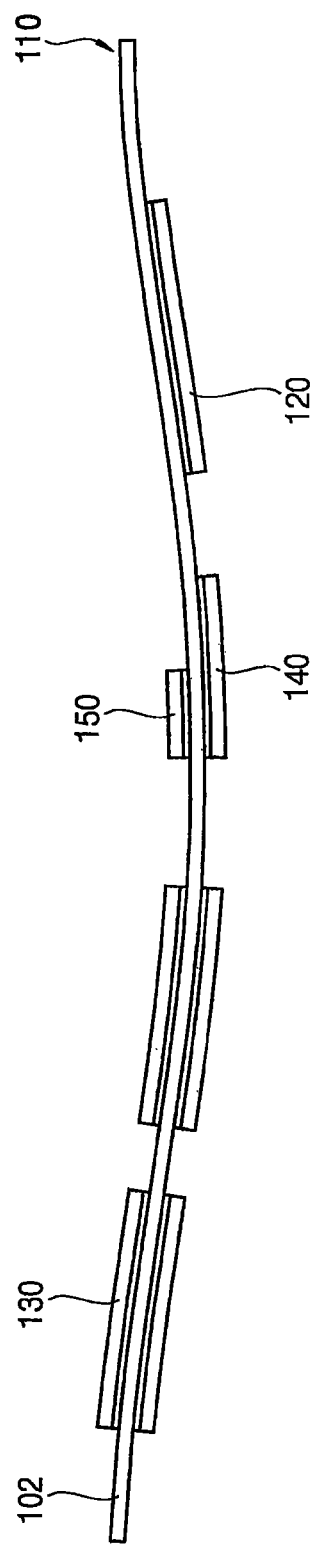
Figure 9:
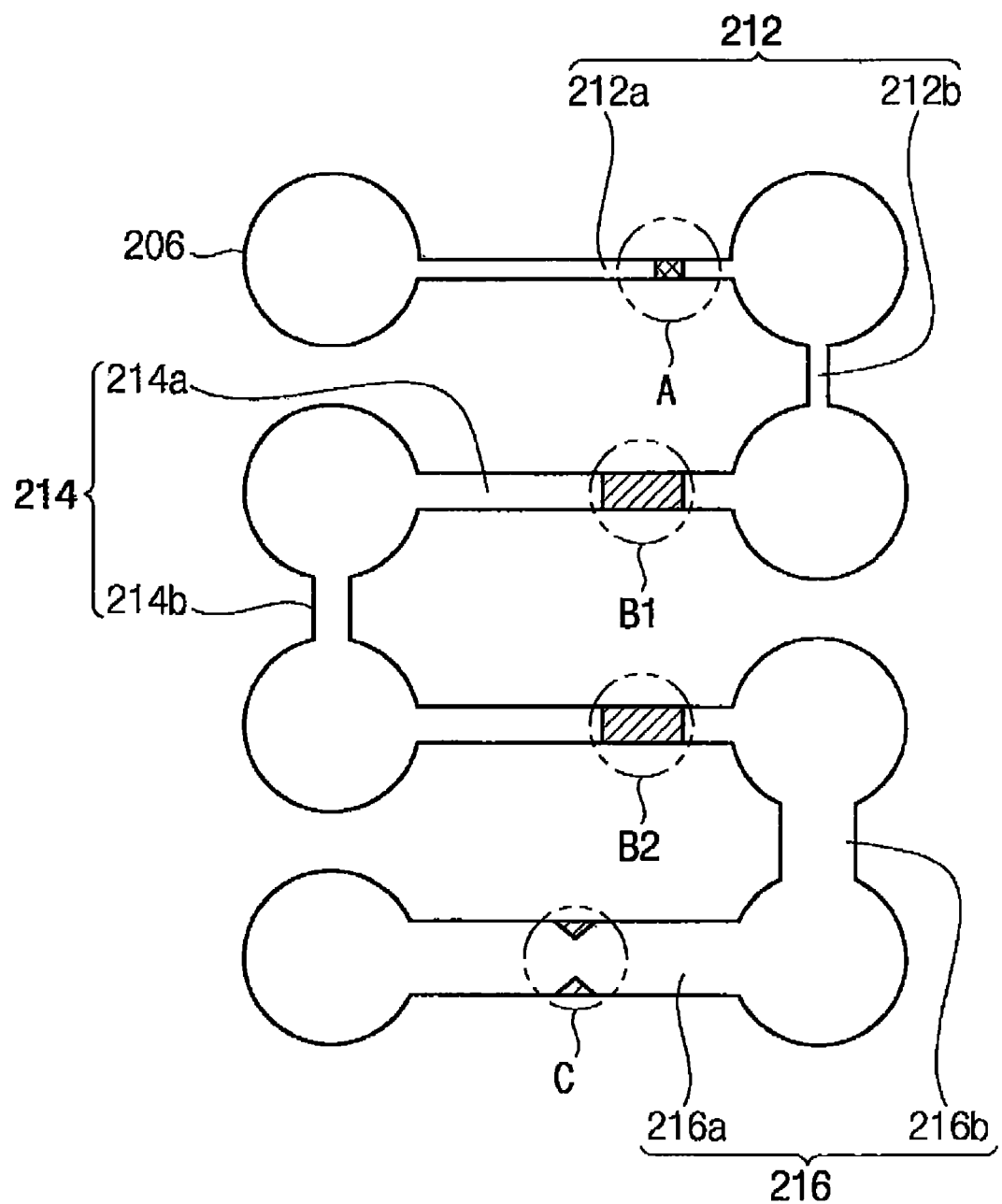

FIG. 8 is a side view illustrating the memory module in FIG. 1 in a deflected state by an external force applied thereto. FIG. 9 is a plan view illustrating a stress distribution across the detection pattern of FIG. 3 in the deflected state.

Referring to FIGS. 8 and 9, when the connector 110 of the module board 102 is inserted into the socket of a notebook computer, the module board 102 may be deflected or bent by an external force to generate a stress on the wiring or solder joint in the module board 102. The memory module may not include a case (housing) which is provided on the upper surface or the lower surface of the module board 102 to cover the module board 102. Accordingly, packages of the electronic elements mounted on the module board 102 may be exposed to the outside. A user may grip side portions of the module board 102 and insert into the socket such that the memory module may be connected to the host, and thus, the module board 102 may be deflected or bent, e.g., by an impact.

The stress detection pattern may include strips having dimensions corresponding to the actual wirings formed in the module board to function as an indicate pattern representing stress distributions exerted on the actual wirings. For example, the stress distribution across the first detection pattern, as illustrated in FIG. 9 may be analyzed to determine a direction and magnitude of the external force applied to the module board 102, a possibility of a crack, etc.

As illustrated in FIG. 9, when the module board 102 is deflected by an external force, a stress of a first magnitude may be generated in an A region of the first width directional strip 212a, stresses of a second magnitude less than the first magnitude may be generated in B1, B2 regions of the second width directional strip 214a, and a stress of a third magnitude less than the second magnitude may be generated in a C region of the third width directional strip 216a. The strips may be configured to provide visual indicia to indicate a level and/or location of stress concentration in response to the applied force.

As mentioned above, the memory module 100 may include a stress detection pattern positioned in a risk zone having a relative weakness to an external force and indicating a stress level generated by the external force, and the stress detection pattern may include a plurality of detection strips having dimensions corresponding to actual wirings formed in the module board.

Accordingly, the detection strips may be inspected to determine and predict a direction and magnitude of the external force exerted on the module board 102, a possibility of damage such as a crack, etc. Further, analysis data may be collected from a plurality of the memory modules having the detection patterns and may be reflected in a design for a memory module.

Figure 10:
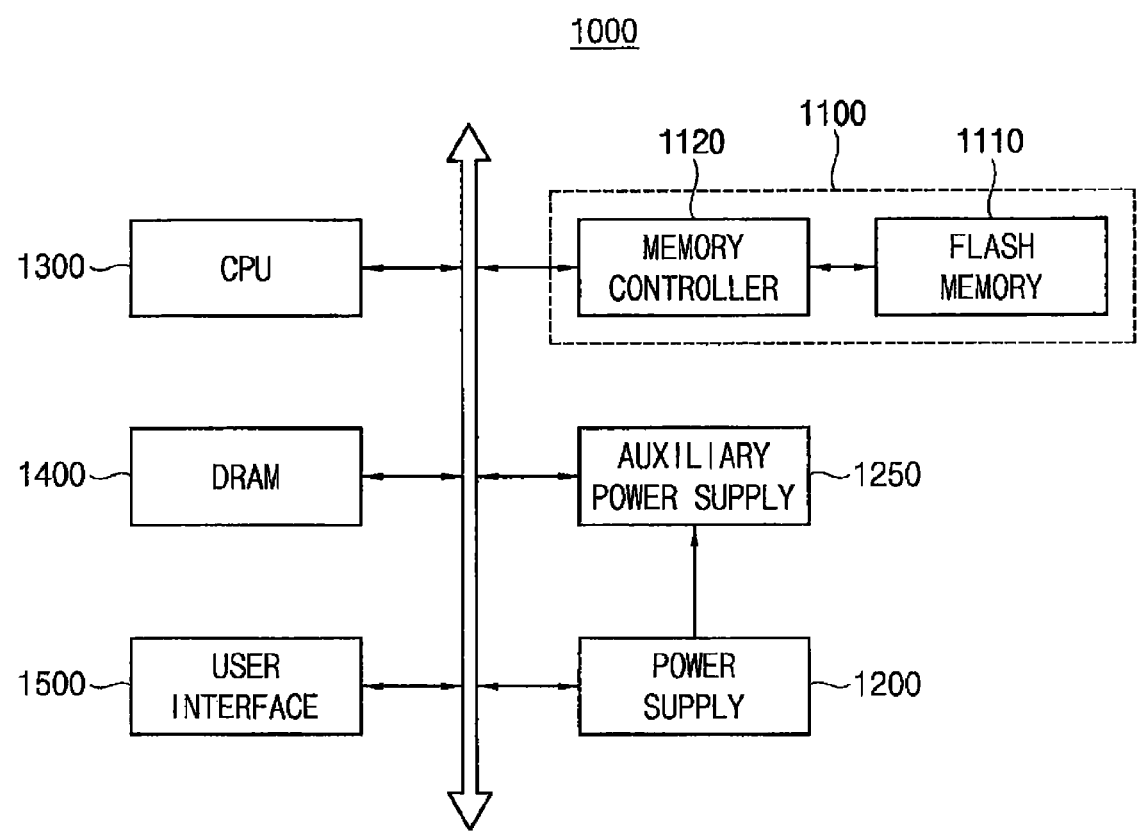

FIG. 10 is a block diagram illustrating an electronic device in accordance with example embodiments.

Referring to FIG. 10, an electronic device 1000 may include a memory system 1100, a power supply 1200, an auxiliary power supply 1250, a central processing unit 1300, a DRAM 1400, and a user interface 1500. The memory system 1100 may include a flash memory 1110 and a memory controller 1120. The memory system 1100 may be embodied as the SSD according to example embodiments. The electronic device 1000 may be embodied as a personal computer PC or a portable electronic device such as a notebook, a cell phone, a personal digital assistant (PDA) and a camera.

The memory module according to example embodiments may be applied to SSD, however, it may not be limited thereto, and the memory module may be embodied as Registered DIMM (RDIMM) module, Unbuffered DIMM (UDIMM), etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A memory module comprising:
   a module board extending in one direction;
   a plurality of electronic elements mounted on the module board; and
   at least one stress detection pattern in a position between the electronic elements or adjacent to one or more of the electronic elements on the module board and including a plurality of strips configured to indicate a stress level generated in the position by an external force applied to the module board.

2. The memory module of claim 1, wherein the strips extend on a surface of the module board and have different widths relative to one another.

3. The memory module of claim 2, wherein the widths of the strips are between a maximum and a minimum of widths of wirings formed in the module board for interconnection with the electronic elements.

4. The memory module of claim 1, wherein a respective one of the strips comprises two directional strips extending in different directions from each other.

5. The memory module of claim 1, wherein the at least one stress detection pattern further comprises a via structure connected to a respective one of the strips and penetrating through at least a portion of the module board.

6. The memory module of claim 5, wherein the at least one stress detection pattern further comprises a pad structure connected to the via structure, the pad structure configured as a detecting pad for detecting electrical characteristics of the strip.

7. The memory module of claim 1, wherein the plurality of strips comprise:
   a first strip having a first width;
   a second strip having a second width greater than the first width; and
   a third strip having a third width greater than the second width.

8. The memory module of claim 7, wherein the first to third widths are between a maximum and a minimum of widths of wirings formed in the module board.

9. The memory module of claim 7, wherein the first to third strips each comprise a first directional strip extending in a first direction and a second directional strip extending in a second direction perpendicular to the first direction.

10. The memory module of claim 7, wherein the at least one stress detection pattern further comprises:
    one or more via structures connected to each of the first to third strips and penetrating at least a portion of the module board; and
    a pad structure connected to each of the via structures.

11. A solid state drive comprising:
    a module board extending in one direction;
    a plurality of non-volatile memory devices mounted on the module board;
    a controller mounted on the module board and configured to control the non-volatile memory devices; and
    at least one stress detection pattern in a position between the non-volatile memory devices and the controller or adjacent to the non-volatile memory devices on the module board and including a plurality of strips configured to indicate a stress level generated in the position by an external force applied to the module board.

12. The solid state drive of claim 11, wherein the strips extend on a surface of the module board and have different widths relative to one another.

13. The solid state drive of claim 12, wherein the widths of the strips are between a maximum and a minimum of widths of wirings for interconnection with the plurality of non-volatile memory devices and/or the controller.

14. The solid state drive of claim 11, wherein a respective one of the strips comprises two directional strips extending in different directions from each other.

15. The solid state drive of claim 11, wherein the stress detection pattern further comprises:
   a via structure connected to each strip and penetrating at least a portion of the module board; and
   a pad structure connected to each via structure.

16. A memory module comprising:
   a module board;
   a plurality of electronic elements mounted on the module board; and
   at least one stress detection pattern in a position on the module board and including a plurality of strips configured to indicate a stress level generated in the position in response to an external force applied to the module board.

17. The memory module of claim 16, wherein the at least one stress detection pattern comprises a first strip having a first width, a second strip having a second width that is greater than the first width, and a third strip having a third width that is greater than the second width, and wherein the first, second and third strips are parallel and spaced apart from one another.

18. The memory module of claim 17, further comprising wires having different widths formed in the module board for interconnection of the electronic elements, wherein the first width of the first strip corresponds to a minimum wire width of the wires, the second width of the second strip corresponds to a median wire width of the wires, and the third width of the third strip corresponds to a maximum wire width of the wires.

19. The memory module of claim 16, wherein the at least one stress detection pattern comprises first and second stress detection patterns, wherein the first stress detection pattern comprises first, second and third parallel and spaced apart strips that extend in a first direction along the module board, and wherein the second stress detection pattern comprises first, second and third parallel and spaced apart strips that extend in a second direction along the module board that is perpendicular to the first direction.

20. The memory module of claim 16, wherein:
   each one of the strips is configured to produce a visual indicia to indicate the stress level at the strip in response to the applied force; and/or
   each one of the strips is configured to provide an electrical signal to indicate the stress level at the strip in response to the applied force.

* * * * *